US009496606B2

(12) United States Patent
Iso et al.

(10) Patent No.: US 9,496,606 B2
(45) Date of Patent: Nov. 15, 2016

(54) TRANSMISSION LINE AND ANTENNA DEVICE

(71) Applicant: Hitachi Metals, Ltd., Tokyo (JP)

(72) Inventors: Naoki Iso, Hitachi (JP); Nobuaki Kitano, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 208 days.

(21) Appl. No.: 14/059,091

(22) Filed: Oct. 21, 2013

(65) Prior Publication Data

US 2014/0152525 A1 Jun. 5, 2014

(30) Foreign Application Priority Data

Dec. 3, 2012 (JP) ................................ 2012-264582

(51) Int. Cl.
*H01Q 1/50* (2006.01)
*H03H 7/38* (2006.01)
(Continued)

(52) U.S. Cl.
CPC ................ *H01Q 1/50* (2013.01); *H01P 3/085* (2013.01); *H01P 3/087* (2013.01); *H01Q 21/0081* (2013.01); *H01Q 21/08* (2013.01)

(58) Field of Classification Search
CPC ............. H01P 1/18; H01P 3/085; H01P 3/087; H01B 11/1856
(Continued)

(56) References Cited

U.S. PATENT DOCUMENTS 3,560,896 A * 2/1971 Essinger ................. H01P 3/085 174/99 R
4,365,222 A * 12/1982 Lampert ............... H01P 11/003 333/238
(Continued)

FOREIGN PATENT DOCUMENTS

JP H 4-019003 2/1992
JP 2000-031709 A 1/2000
(Continued)

OTHER PUBLICATIONS

Cohn "Characteristic Impedance of the Shielded-Strip Transmission Line" Transactions of the IRE Professional Group on Microwave Theory and Techniques (vol. 2 , Issue: 2), Jan. 6, 2003.*
(Continued)

*Primary Examiner* — Dameon E Levi
*Assistant Examiner* — Ricardo Magallanes
(74) *Attorney, Agent, or Firm* — McGinn IP Law Group, PLLC

(57) ABSTRACT

A transmission line has a triplate line including a first outer conductor and a second outer conductor disposed in parallel with each other at a predetermined interval, and a central conductor disposed in a space between the first outer conductor and the second outer conductor; and a dielectric spacer interposed between the first and second outer conductors and the central conductor and configured to support the central conductor. The central conductor has a supported portion supported by the dielectric spacer, and first and second high-impedance portions having characteristic impedances higher than a characteristic impedance in the supported portion. The first and second high-impedance portions are disposed on input and output sides, respectively, of the supported portion.

16 Claims, 9 Drawing Sheets

(51) Int. Cl.

| | |
|---|---|
| ***H01P 3/08*** | (2006.01) |
| ***H01P 3/06*** | (2006.01) |
| ***H01B 17/00*** | (2006.01) |
| ***H01Q 21/00*** | (2006.01) |
| ***H01Q 21/08*** | (2006.01) |

(58) Field of Classification Search
USPC ...... 343/862; 333/33, 26, 244, 238; 174/174
See application file for complete search history.

(56) References Cited

U.S. PATENT DOCUMENTS 5,790,002 A * 8/1998 Fischer ................ H01B 11/186 174/174
6,600,395 B1 * 7/2003 Handforth ............... H01P 3/085 174/117 AS
6,816,039 B1 * 11/2004 Taylor ........................ H01P 3/06 333/243
2009/0174609 A1 * 7/2009 Sanada ............... H01P 1/20381 343/700 MS

FOREIGN PATENT DOCUMENTS

JP 2003-264420 A 9/2003
JP 2004-320521 A 11/2004

OTHER PUBLICATIONS

Japanese Office Action dated Dec. 1, 2015 with an English translation.

* cited by examiner

TRANSMISSION LINE AND ANTENNA DEVICE

The present application is based on Japanese patent application No. 2012-264582 filed on Dec. 3, 2012, the entire contents of which are incorporated herein by reference.

BACKGROUND OF THE INVENTION

1. Field of the Invention

The present invention relates to a transmission line and an antenna device including the transmission line.

2. Description of the Related Art

In an antenna device for a radio communication apparatus, such as a mobile terminal, a transmission line for transmitting high-frequency signals has been used, which forms a distributor or a multiplexer between a high-frequency power source and a transmitting/receiving device. Examples of the transmission line include a microstrip line and a triplate line, which is formed by a pair of outer conductors disposed in parallel with each other and a plate-like central conductor interposed therebetween (see, e.g., Japanese Unexamined Patent Application Publication No. 2003-264420).

A triplate line described in Japanese Unexamined Patent Application Publication No. 2003-264420 includes an inner conductor and a pair of outer conductors facing each other with the inner conductor interposed therebetween, the outer conductors being an outer conductor (first outer conductor) and a reflective plate (second outer conductor). The inner conductor is connected at one end to a feeding transformer in an antenna element, and is connected at the other end to a feeding unit. There is a space between the inner conductor and the first outer conductor, and between the inner conductor and the second outer conductor.

Characteristics of a triplate line of this type tend to be unstable, due to positional displacement of a central conductor or changes in distance between outer conductors. Therefore, particularly when the triplate line is relatively large in size, the central conductor needs to be supported between the outer conductors by a spacer made of an insulator, such as resin.

However, since such a spacer itself has a unique dielectric constant higher than that of air, an impedance in a supported portion of the central conductor supported by the spacer is lower than an impedance in the surrounding area. This results in an impedance mismatch and reflection of high-frequency signals.

As a measure to reduce reflections, the present inventors initially intended to narrow the line width of the supported portion of the central conductor. With this method, the supported portion itself exhibits an impedance higher than that of the surrounding area depending on the line width. Therefore, by setting the line width of the supported portion in consideration of the dielectric constant of the spacer, the impedance in the supported portion can be matched to the characteristic impedance of the triplate line in the surrounding area, and reflections can be reduced.

However, assume for example that the supported portion has a through hole passing therethrough in the direction of thickness of the central conductor, and that the spacer is secured to the supported portion by inserting part of the spacer into the through hole. In this case, the line width of the supported portion is extremely narrow in the area around the through hole. Because this may affect the mechanical strength of the supported portion, it has been difficult in practice to provide such a through hole in the supported portion.

SUMMARY OF THE INVENTION

An object of the present invention is to provide a transmission line and an antenna device that can reduce reflections while ensuring strength in a supported portion of a central conductor.

To solve the problems described above, the present invention provides a transmission line that has a triplate line including a pair of outer conductors disposed in parallel with each other at a predetermined interval, and a central conductor disposed in a space between the pair of outer conductors; and a spacer interposed in the space between the pair of outer conductors and the central conductor, the spacer being made of a dielectric material and configured to support the central conductor. The central conductor has a supported portion supported by the spacer, and first and second high-impedance portions having characteristic impedances higher than a characteristic impedance in the supported portion. The first and second high-impedance portions are disposed on input and output sides, respectively, of the supported portion.

According to the present invention, it is possible to reduce reflections while ensuring strength in the supported portion of the central conductor.

BRIEF DESCRIPTION OF THE DRAWINGS

FIG. 2A is a Smith chart showing a change in characteristic impedance caused by providing a first high-impedance portion on an input side of a triplate line, FIG. 2B is a Smith chart showing a change in characteristic impedance caused by providing a supported portion, and FIG. 2C is a Smith chart showing a change in characteristic impedance caused by providing a second high-impedance portion on an output side of the triplate line.

FIG. 3A is a Smith chart showing a change in characteristic impedance caused by providing the first high-impedance portion, FIG. 3B is a Smith chart showing a change in characteristic impedance caused by providing the supported portion, and FIG. 3C is a Smith chart showing a change in characteristic impedance caused by providing the second high-impedance portion.

DESCRIPTION OF THE PREFERRED EMBODIMENTS

A transmission line according to an embodiment of the present invention will now be described with reference to the attached drawings.

Figure 1A:
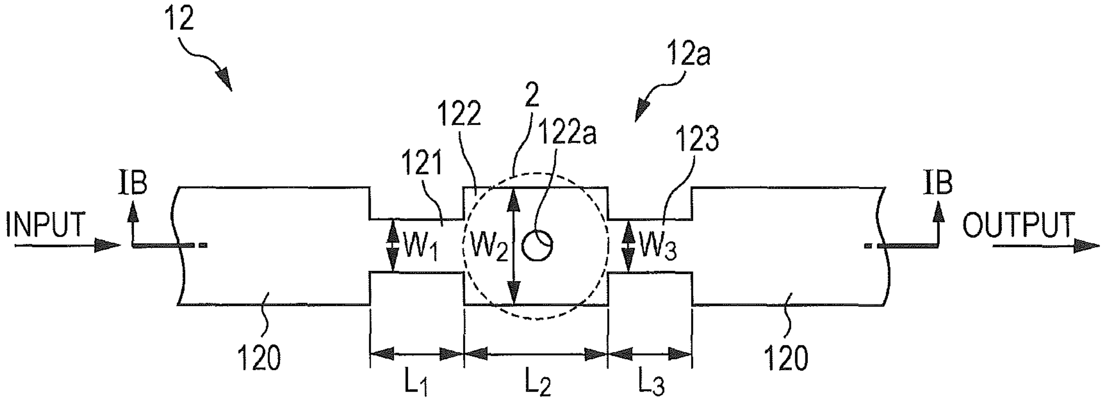
FIG. 1A is a plan view illustrating a configuration of a transmission line according to an embodiment of the present invention.
Figure 1B:
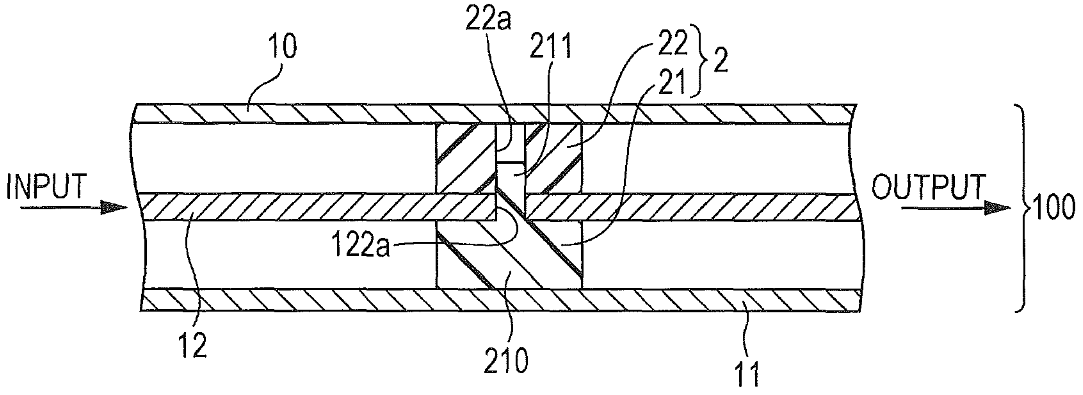
FIG. 1B is a cross-sectional view taken along line IB-IB of FIG. 1A.

FIG. 1A is a plan view illustrating a configuration of a transmission line according to an embodiment of the present invention. FIG. 1B is a cross-sectional view taken along line IB-IB of FIG. 1A.

As illustrated in FIG. 1B, a transmission line 1 includes a triplate line 100 and a dielectric spacer 2. The triplate line 100 includes a first outer conductor 10 and a second outer conductor 11 disposed in parallel at a predetermined interval, and a central conductor 12 disposed in a space between the first outer conductor 10 and the second outer conductor 11. The dielectric spacer 2 made of a dielectric material is interposed between the first and second outer conductors 10 and 11 and the central conductor 12, and configured to support the central conductor 12.

The present embodiment describes an example where the first and second outer conductors 10 and 11 and the central conductor 12 are each formed by a plate-like body made of a conductive metal, such as copper or brass. Alternatively, the first and second outer conductors 10 and 11 and the central conductor 12 may each be formed, for example, by a plate-like resin member covered with metal foil on one or both sides.

The central conductor 12 is rectangular in cross section orthogonal to its extending direction. The thickness of the central conductor 12 is, for example, 1 mm. The distance between the first outer conductor 10 and the second outer conductor 11 is, for example, 5 mm. The cross-sectional shape and the thickness of the central conductor 12 and the distance between the first outer conductor 10 and the second outer conductor 11 may be appropriately determined, for example, by taking a target characteristic impedance of the triplate line 100 into consideration.

The central conductor 12 has a supported portion 122 supported by the dielectric spacer 2, a first high-impedance portion 121 formed on one side (input side) of the supported portion 122 along the extending direction of the central conductor 12, and a second high-impedance portion 123 formed on the other side (output side) of the supported portion 122 along the extending direction of the central conductor 12. In the following description, a substantial part of the central conductor 12 other than the first high-impedance portion 121, the supported portion 122, and the second high-impedance portion 123 will be referred to as a main body 120. The supported portion 122 has a through hole 122*a* in its center. The through hole 122*a* passes through the central conductor 12 in the thickness direction.

The line width of the central conductor 12 in the width direction orthogonal to the extending direction of the central conductor 12 (i.e., the right-left direction in FIG. 1A) is smaller in the first high-impedance portion 121 and the second high-impedance portion 123 than in the supported portion 122. For example, a line width $W_2$ of the supported portion 122 is 4 mm to 6 mm, whereas a line width $W_1$ of the first high-impedance portion 121 and a line width $W_3$ of the second high-impedance portion 123 are 2 mm to 3 mm. The diameter of the through hole 122*a* in the supported portion 122 is, for example, 2 mm to 3 mm.

As illustrated in FIG. 1B, the dielectric spacer 2 is formed by combining a first spacer member 21 with a second spacer member 22. The first spacer member 21 has a circular plate-like base 210 and a cylindrical protrusion 211 protruding continuously from the base 210. The diameter of the base 210 is greater than the line width $W_2$ of the supported portion 122 and is, for example, 5 mm to 7 mm. The thickness of the base 210 is, for example, 2 mm.

The second spacer member 22 is a circular plate-like member having a fitting hole 22*a* in its center. The protrusion 211 of the first spacer member 21 is fitted into the fitting hole 22*a*. The diameter (outside diameter) and the thickness of the second spacer member 22 are the same as the diameter and the thickness, respectively, of the base 210 of the first spacer member 21. The fitting hole 22*a* passes through the second spacer member 22 in the thickness direction.

The protrusion 211 of the first spacer member 21 passes through the through hole 122*a* in the supported portion 122 of the central conductor 12 and is fitted into the fitting hole 22*a* of the second spacer member 22. The base 210 of the first spacer member 21 is interposed between the second outer conductor 11 and the central conductor 12. The second spacer member 22 is interposed between the first outer conductor 10 and the central conductor 12. The dielectric spacer 2 supports the central conductor 12 at the supported portion 122 by combining the first spacer member 21 and the second spacer member 22 together such that the supported portion 122 of the central conductor 12 is sandwiched therebetween. Hereinafter, a part formed by the first high-impedance portion 121, the supported portion 122, and the second high-impedance portion 123 will be referred to as a support structure part 12*a*.

When the supported portion 122 of the transmission line 1 is supported by the dielectric spacer 2, a characteristic impedance in the supported portion 122 is lower than a characteristic impedance of the supported portion 122 itself (i.e., a characteristic impedance in the supported portion 122 obtained in the absence of the dielectric spacer 2). In the following description, the characteristic impedance in the supported portion 122 will refer to a characteristic impedance in the supported portion 122 supported by the dielectric spacer 2.

The shape and the structure of the dielectric spacer 2 are not limited to those illustrated in FIGS. 1A and 1B, as long as the dielectric spacer 2 is interposed between the first and second outer conductors 10 and 11 and the central conductor 12 and is configured to support the central conductor 12 in the supported portion 122. For example, the base 210 of the first spacer member 21 and the second spacer member 22 may not be circular and may be, for example, rectangular in shape. A material used to make the dielectric spacer 2 is not particularly limited, as long as the dielectric spacer 2 itself is dielectric. For example, resin, such as polyethylene, may be used to make the dielectric spacer 2.

A characteristic impedance $Z_1$ of the first high-impedance portion 121 and a characteristic impedance $Z_3$ of the second high-impedance portion 123 are higher than a characteristic impedance $Z_2$ in the supported portion 122 supported by the dielectric spacer 2 ($Z_1>Z_2$ and $Z_3>Z_2$). Preferably, the characteristic impedances $Z_1$ and $Z_3$ of the first high-impedance portion 121 and the second high-impedance portion 123 are higher than a characteristic impedance $Z_0$ of the main body 120 of the central conductor 12. In this case, the characteristic impedance $Z_2$ in the supported portion 122 is lower than or equal to the characteristic impedance $Z_0$ of the main body 120. This means that the inequalities $Z_1>Z_0\geq Z_2$ and $Z_3>Z_0\geq Z_2$ are satisfied. The characteristic impedances $Z_1$ and $Z_3$ of the first high-impedance portion 121 and the second high-impedance portion 123 may either be the same ($Z_1=Z_3$) or different ($Z_1>Z_3$ or $Z_1<Z_3$).

An impedance adjustment between the first high-impedance portion 121 and the second high-impedance portion 123 can be made by setting their line lengths $L_1$ and $L_3$ and the line widths $W_1$ and $W_3$ in accordance with set values of the characteristic impedances $Z_1$ and $Z_3$.

As described above, the first high-impedance portion 121 and the second high-impedance portion 123 having impedances higher than the characteristic impedance $Z_2$ in the supported portion 122 are provided on the input side and the output side, respectively, of the supported portion 122 that lowers its characteristic impedance when it is supported by the dielectric spacer 2. Thus, impedance matching of the entire transmission line 1 is achieved, and reflection of high-frequency signals can be reduced.

Since the line width $W_2$ of the supported portion 122 can be made greater than the line widths $W_1$ and $W_3$ of the first high-impedance portion 121 and the second high-impedance portion 123, the strength of the supported portion 122 can be ensured even when there is the through hole 122*a*. That is, it is possible to reduce reflections in the transmission line 1 while ensuring the strength of the supported portion 122.

Next, the basic idea of impedance matching will be described using Smith charts.

Figure 2A:
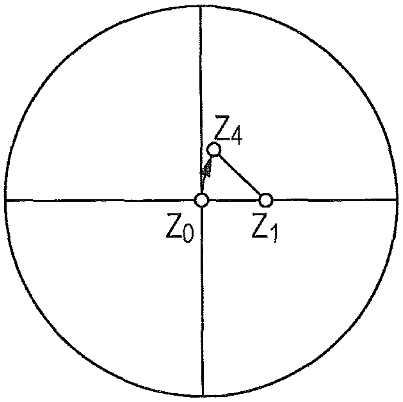
FIGS. 2A to 2C are diagrams for explaining impedance matching of the transmission line.
Figure 2B:
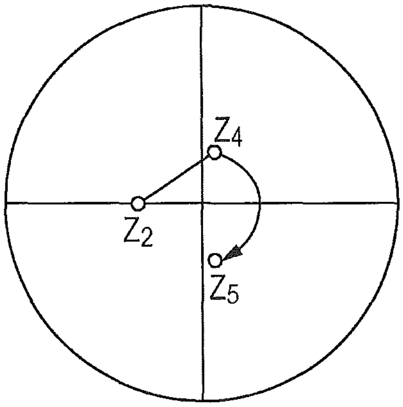
Figure 2C:
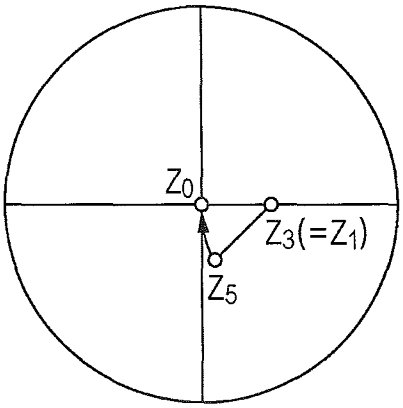

FIGS. 2A to 2C are diagrams for explaining impedance matching of the transmission line 1. FIG. 2A is a Smith chart showing a change in characteristic impedance caused by providing the first high-impedance portion 121. FIG. 2B is a Smith chart showing a change in characteristic impedance caused by providing the supported portion 122. FIG. 2C is a Smith chart showing a change in characteristic impedance caused by providing the second high-impedance portion 123. Although normalized impedances are typically plotted on Smith charts, a characteristic impedance in each part of the transmission line 1 is directly plotted here, for convenience of the following description.

FIG. 2A shows that by providing the first high-impedance portion 121 (characteristic impedance $Z_1$), the characteristic impedance moves from $Z_0$ to $Z_4$ by the line length $L_1$ of the first high-impedance portion 121. Next, FIG. 2B shows that by providing the supported portion 122 (characteristic impedance $Z_2$) on the output side of the first high-impedance portion 121, the characteristic impedance $Z_4$ moves, by the line length $L_2$ of the supported portion 122, to a characteristic impedance $Z_5$ at a position symmetric with respect to the horizontal axis representing the real part of the complex reflection coefficient in the Smith chart. Then FIG. 2C shows that by providing the second high-impedance portion 123 (characteristic impedance $Z_3$) on the output side of the supported portion 122, the characteristic impedance $Z_5$ returns to the characteristic impedance $Z_0$ of the main body 120 of the triplate line 100 by the line length $L_3$ of the second high-impedance portion 123, so that impedance matching in the transmission line 1 as viewed from the input side is ensured. This can reduce signal reflections.

Next, impedance matching will be described, which is achieved when the line width of the supported portion 122 is increased for greater mechanical strength of the supported portion 122.

Figure 3A:
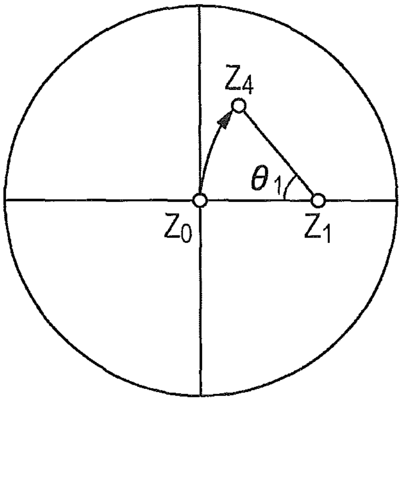
FIGS. 3A to 3C are diagrams for explaining impedance matching of the transmission line achieved when the line width of the supported portion is set to be greater.
Figure 3B:
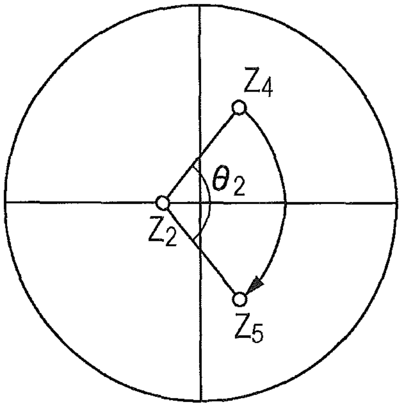
Figure 3C:
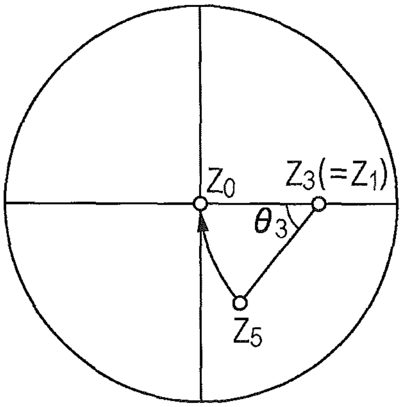

FIGS. 3A to 3C are diagrams for explaining impedance matching of the transmission line 1 achieved when the line width of the supported portion 122 is set to be greater. FIG. 3A is a Smith chart showing a change in characteristic impedance caused by providing the first high-impedance portion 121. FIG. 3B is a Smith chart showing a change in characteristic impedance caused by providing the supported portion 122. FIG. 3C is a Smith chart showing a change in characteristic impedance caused by providing the second high-impedance portion 123.

Setting the line width $W_2$ and the line length $L_2$ of the supported portion 122 determines the characteristic impedance $Z_2$ of the supported portion 122, and also determines the amount of movement of the impedance from $Z_4$ to $Z_5$ and an angle $\theta_2$ in FIG. 3B. Then, the characteristic impedance $Z_1$ of the first high-impedance portion 121 and the characteristic impedance $Z_3$ of the second high-impedance portion 123 are adjusted to $Z_4$ and $Z_5$, respectively, in FIG. 3B.

Specifically, the line length $L_1$ and the line width $W_1$ of the first high-impedance portion 121 are set such that, as illustrated in FIG. 3A, the characteristic impedance $Z_1$ of the first high-impedance portion 121 coincides with a point at which a straight line inclined by an angle $\theta_1$ ($\theta_1=\theta_2/2$) with respect to the horizontal axis of the Smith chart and passing through $Z_4$ intersects the horizontal axis.

Also, the line length $L_3$ and the line width $W_3$ of the second high-impedance portion 123 are set such that, as illustrated in FIG. 3C, the characteristic impedance $Z_3$ of the second high-impedance portion 123 coincides with a point at which a straight line inclined by an angle $\theta_3$ ($\theta_3=\theta_2/2$) with respect to the horizontal axis of the Smith chart and passing through $Z_5$ intersects the horizontal axis. Thus, it is possible to ensure impedance matching, reduce signal reflections, and ensure mechanical strength of the supported portion 122.

When the characteristic impedances $Z_1$ and $Z_3$ of the first high-impedance portion 121 and the second high-impedance portion 123 are equal, a relational equation representing the relationship among the characteristic impedances $Z_0$, $Z_1$ ($=Z_3$), and $Z_2$ can be obtained in the following manner.

Figure 4:
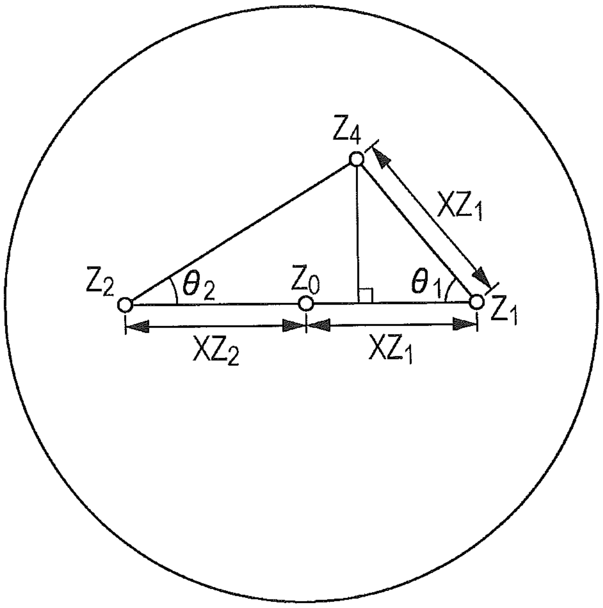
FIG. 4 is a Smith chart showing a change in characteristic impedance caused by providing the supported portion, the first high-impedance portion, and the second high-impedance portion of the transmission line.

FIG. 4 is a Smith chart showing a change in characteristic impedance caused by providing the supported portion 122, the first high-impedance portion 121, and the second high-impedance portion 123 of the transmission line 1.

In a triangle having the characteristic impedances $Z_2$, $Z_4$, and $Z_1$ as its vertices in FIG. 4, $\theta_1$ and $\theta_2$ can be determined by the following equations (Equation 1):

$$\theta_1 = \frac{L_1}{\lambda} \cdot 4\pi = \frac{4\pi}{\lambda} L_1 \qquad \text{Equation 1}$$

$$\theta_2 = \frac{\frac{1}{2} L_2}{\lambda} \cdot 4\pi = \frac{2\pi}{\lambda} L_2$$

where $L_1$ is the line length of the first high-impedance portion 121 and the second high-impedance portion 123, and $L_2$ is the line length of the supported portion 122.

For the triangle illustrated in FIG. 4, the following equation (Equation 2) can be obtained using symbols shown in FIG. 4:

$$XZ_1 \sin\left(\frac{4\pi}{\lambda} L_1\right) = \left\{XZ_1 + XZ_2 - XZ_1 \cos\left(\frac{4\pi}{\lambda} L_1\right)\right\} \tan\left(\frac{2\pi}{\lambda} L_2\right) \qquad \text{Equation 2}$$

where $XZ_1$ and $XZ_2$ can be given by the following equations (Equation 3).

$$XZ_1 = \frac{Z_1 + Z_0}{Z_1 + Z_0} \quad \text{Equation 3}$$

$$XZ_2 = \frac{Z_0 - Z_2}{Z_0 + Z_2}$$

By substituting the equations for $XZ_1$ and $XZ_2$ in Equation 3 into the equation in Equation 2 and expanding and rearranging the resulting equation, a relational equation representing the relationship among three values, the characteristic impedance $Z_1$ of the first high-impedance portion 121 and the second high-impedance portion 123, the characteristic impedance $Z_0$ of the transmission line 1, and the characteristic impedance $Z_2$ of the supported portion 122, is obtained as in the following equation (Equation 4). From the relational equation shown in Equation 4, the characteristic impedance $Z_1$ can be calculated when the characteristic impedance $Z_0$ of the main body 120, the characteristic impedance $Z_2$ of the supported portion 122, and the line lengths $L_1$ and $L_2$ are known.

$$Z_1 = \frac{(Z_0 Z_2 + Z_0^2)\left\{\sin\left(\frac{4\pi}{\lambda}L_1\right) + \cos\left(\frac{4\pi}{\lambda}L_1\right)\tan\left(\frac{2\pi}{\lambda}L_2\right)\right\} - 2Z_0Z_2\tan\left(\frac{2\pi}{\lambda}L_2\right)}{(Z_0 + Z_2)\left\{\sin\left(\frac{4\pi}{\lambda}L_1\right) + \cos\left(\frac{4\pi}{\lambda}L_1\right)\tan\left(\frac{2\pi}{\lambda}L_2\right)\right\} - 2\tan\left(\frac{2\pi}{\lambda}L_2\right)Z_0} \quad \text{Equation 4}$$

Figure 5:
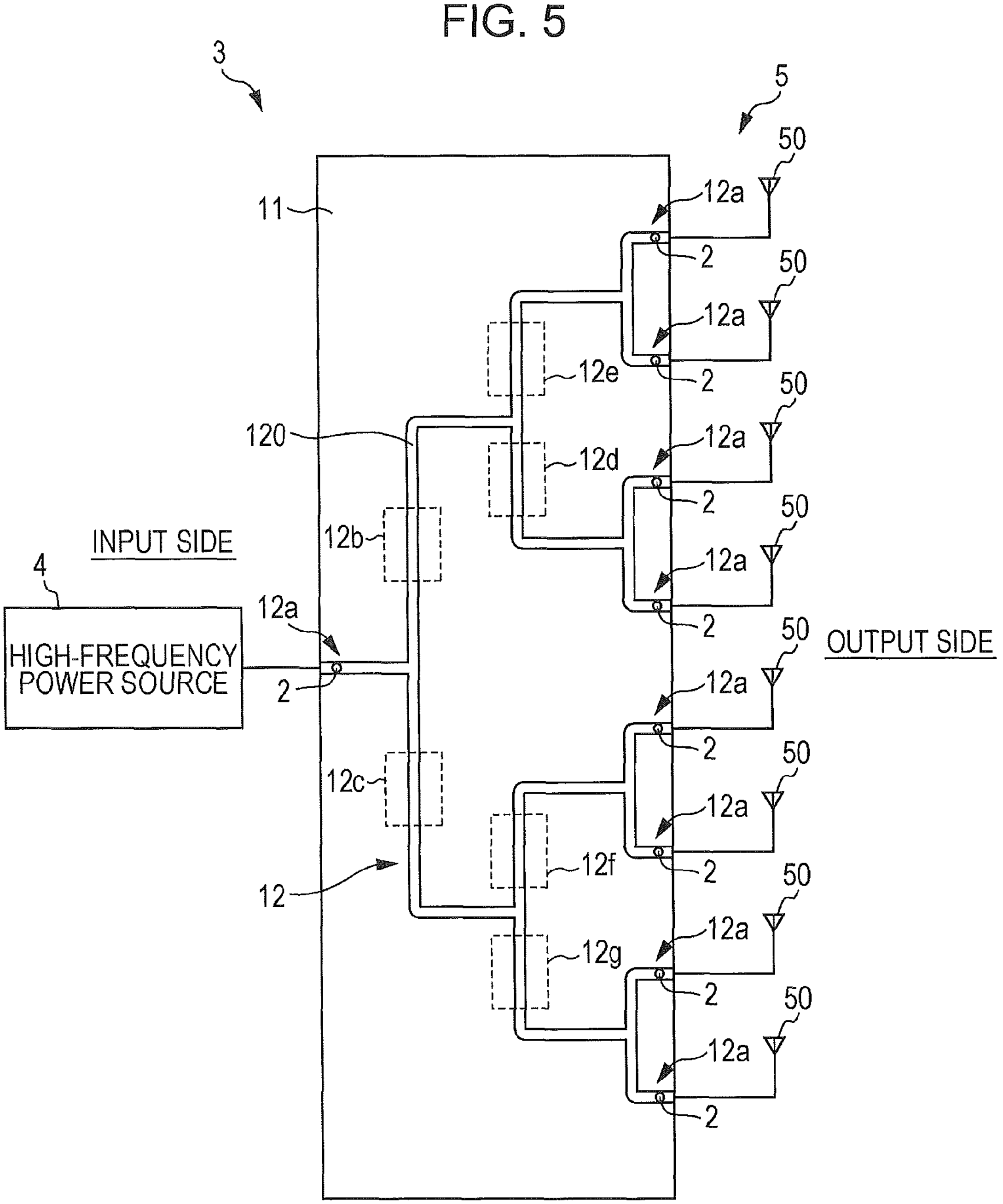
FIG. 5 is a schematic view illustrating a configuration of a distributor which is an application of the transmission line, the distributor being configured to distribute signals from a high-frequency power source serving as a transmitting device to a plurality of antenna elements.

FIG. 5 is a schematic view illustrating a configuration of a distributor which is an application of the transmission line 1, the distributor being configured to distribute signals from a high-frequency power source serving as a transmitting device to a plurality of antenna elements.

A distributor 3 illustrated in FIG. 5 includes the first outer conductor 10 and the second outer conductor 11 disposed at a predetermined interval (the first outer conductor 10 on the near side of the drawing is not shown), and the central conductor 12 disposed in the space between the first outer conductor 10 and the second outer conductor 11. In the example illustrated in FIG. 5, the central conductor 12 is sequentially divided, from the input side connected to a high-frequency power source 4, into eight terminals on the output side (i.e., the number of distributions is eight). The eight terminals are connected to respective antenna elements 50. The distributor 3 and the antenna elements 50 form an antenna device 5. The number of distributions is not particularly limited to the value described above. Reference numerals 12*b* to 12*g* in FIG. 5 denote meandering portions for phase adjustment. The meandering portions will not be described here, as they are not directly related to the present invention.

The distributor 3 illustrated in FIG. 5 includes support structure parts 12*a* at nine points near terminals on the input and output sides of the central conductor 12. The support structure parts 12*a* (each including the supported portion 122 and the first and second high-impedance portions 121 and 123) are similar to that illustrated in FIG. 1A. Each supported portion 122 is supported by the corresponding dielectric spacer 2.

In the distributor 3 illustrated in FIG. 5, the first high-impedance portion 121 and the second high-impedance portion 123 are also disposed on the input side and the output side of each supported portion 122. Again, this makes it possible to increase the line width $W_2$ of the supported portion 122 to ensure mechanical strength of the supported portion 122 while ensuring impedance matching and reducing signal reflections.

Figure 6:
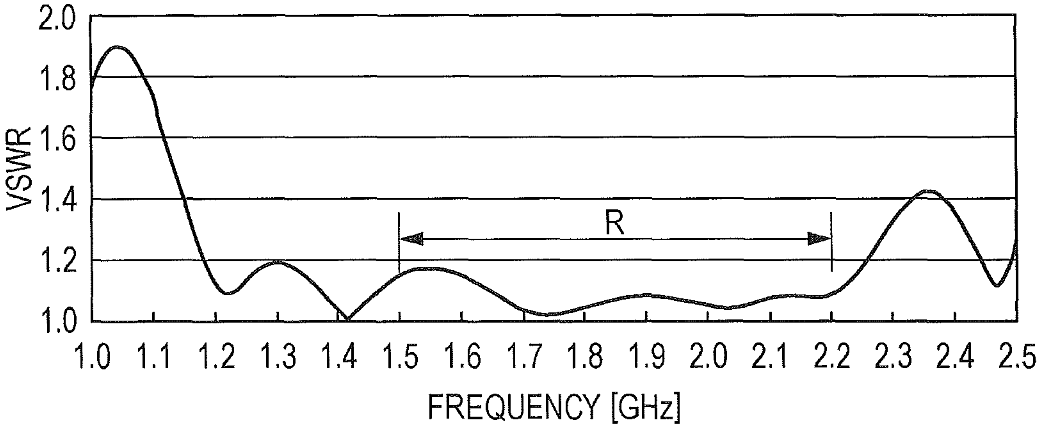
FIG. 6 is a graph showing band characteristics in the frequency range of 1.0 GHz to 2.5 GHz examined for the distributor.

FIG. 6 is a graph showing band characteristics in the frequency range of 1.0 GHz to 2.5 GHz examined for the distributor 3 configured as described above. The graph shows that a voltage standing wave ratio (VSWR) of less than 1.2 can be achieved particularly in a frequency range R (1.5 GHz to 2.2 GHz). This is because providing the first high-impedance portion 121 and the second high-impedance portion 123 on the input side and the output side of the supported portion 122 makes it possible to ensure impedance matching and reduce signal reflections.

The distributor 3 that distributes signals from the high-frequency power source 4 to the plurality of antenna elements 50 has been described with reference to FIG. 5. The transmission line 1 of the present invention is applicable not only to the distributor 3 placed between the plurality of antenna elements 50 and the transmitting device (high-frequency power source 4), but also to a multiplexer placed between the plurality of antenna elements 50 and a receiving device, the multiplexer being configured to combine a plurality of high-frequency signals and guides them to the receiving device.

EXAMPLES

Example 1

Figure 7A:
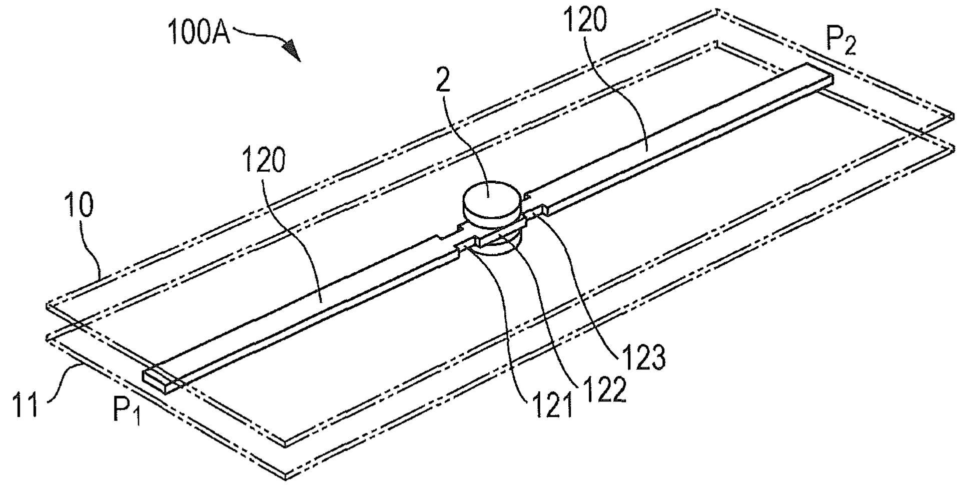
FIG. 7A is an external perspective view of a triplate line according to Example 1 of the present invention.
Figure 7B:
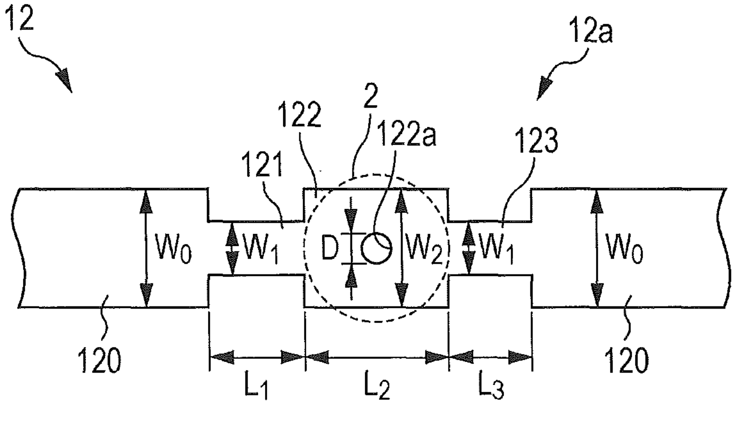
FIG. 7B is an enlarged view of a main part of the triplate line.
Figure 8A:
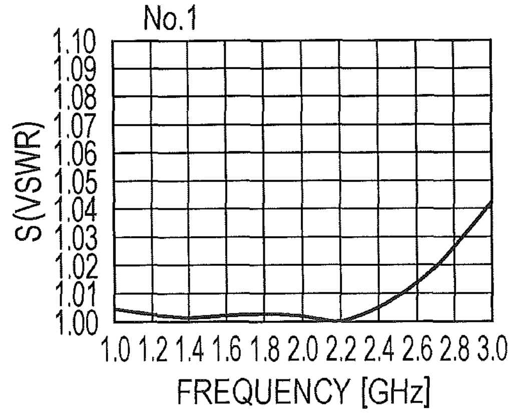
FIGS. 8A to 8E show voltage standing wave ratios (VSWRs) measured for transmission lines Nos. 1 to 5 according to Example 1.
Figure 8D:
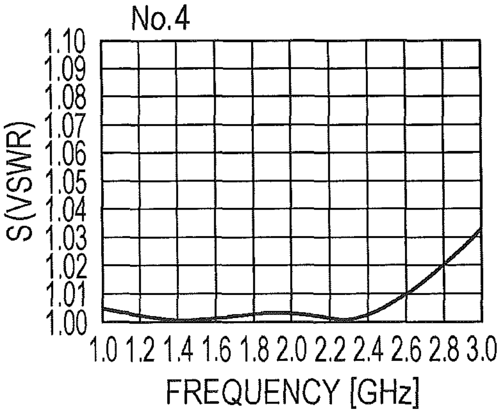
Figure 8B:
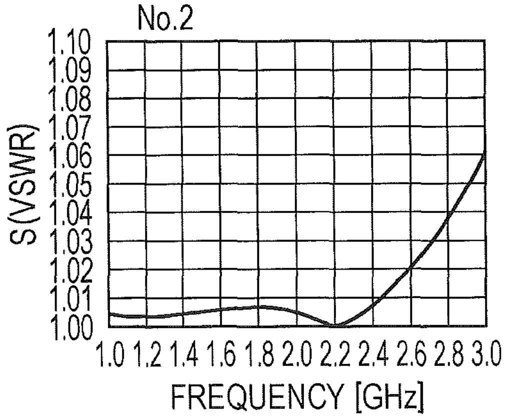
Figure 8E:
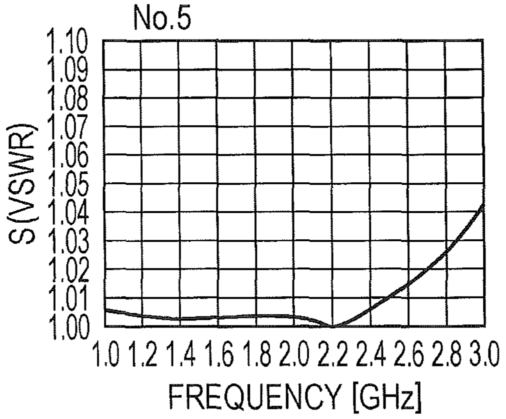
Figure 8C:
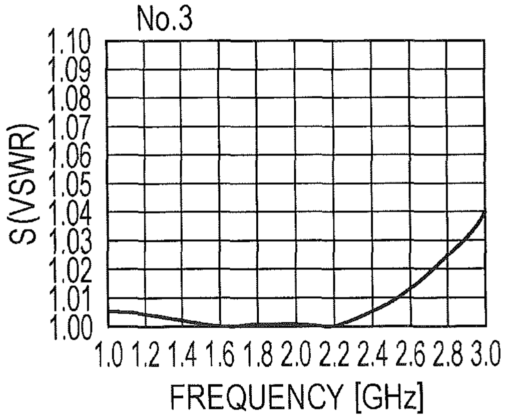

FIG. 7A is an external perspective view of a triplate line 100A according to Example 1 of the present invention. FIG. 7B is an enlarged view of a main part of the triplate line 100A.

As illustrated in FIG. 7A, the triplate line 100A is formed by the first and second outer conductors 10 and 11, and the central conductor 12 having a long narrow plate-like shape. A distance between the first outer conductor 10 and the second outer conductor 11 is 5 mm, and a thickness of the central conductor 12 is 1 mm. The central conductor 12 has, in its center, the supported portion 122 and the first and second high-impedance portions 121 and 123 similar to those illustrated in FIG. 1A. The supported portion 122 has the through hole 122*a* (see FIG. 7B) having a diameter D of 2 mm. The supported portion 122 is supported by the dielectric spacer 2 having a structure similar to that of the dielectric spacer 2 illustrated in FIG. 1B.

The line width $W_1$ and the line length $L_1$ of the first high-impedance portion 121 and the line width $W_2$ and the line length $L_2$ of the supported portion 122, illustrated in FIG. 7B, were set to values shown in Table 1 below, and five transmission lines Nos. 1 to 5 were obtained. The line width and the line length of the second high-impedance portion 123 were set to be the same as the line width $W_1$ and the line length $L_1$, respectively, of the first high-impedance portion 121. A line width $W_0$ of the main body 120 of the central conductor 12 was set to be the same as the line width $W_2$ of the supported portion 122.

An S-parameter (VSWR) simulation in the frequency range of 1.0 GHz to 3.0 GHz was performed for each of the transmission lines Nos. 1 to 5. A three-dimensional simulator Femtet was used for the simulation.

TABLE 1

| | $W_1$ (mm) | $W_2$ (mm) | $L_1$ (mm) | $L_2$ (mm) |
|---|---|---|---|---|
| No. 1 | 2.2 | 4.6 | 3.0 | 6.0 |
| No. 2 | 2.4 | 4.0 | 5.0 | 6.0 |
| No. 3 | 2.7 | 5.0 | 3.0 | 6.0 |
| No. 4 | 2.9 | 5.2 | 3.0 | 6.0 |
| No. 5 | 2.4 | 4.8 | 3.0 | 6.0 |

FIGS. 8A to 8E show VSWRs measured for the transmission lines Nos. 1 to 5 according to Example 1.

As is obvious from FIGS. 8A to 8E, the VSWR of any of the five transmission lines is less than 1.01 in the frequency range of 1.0 GHz to 2.2 GHz, increases as the frequency increases in the frequency range of 2.2 GHz to 3.0 GHz, and is as low as less than 1.07 (No. 2) at 3.0 GHz.

This indicates that by adding the first and second high-impedance portions 121 and 123 having a line width of 2.2 mm to 2.9 mm to the supported portion 122 having a line width of 4.0 mm to 5.2 mm, it is possible to achieve impedance matching of the transmission line, lower the VSWR to less than 1.07 in the frequency range of 1.0 GHz to 3.0 GHz, and reduce reflections.

Example 2

Figure 9A:
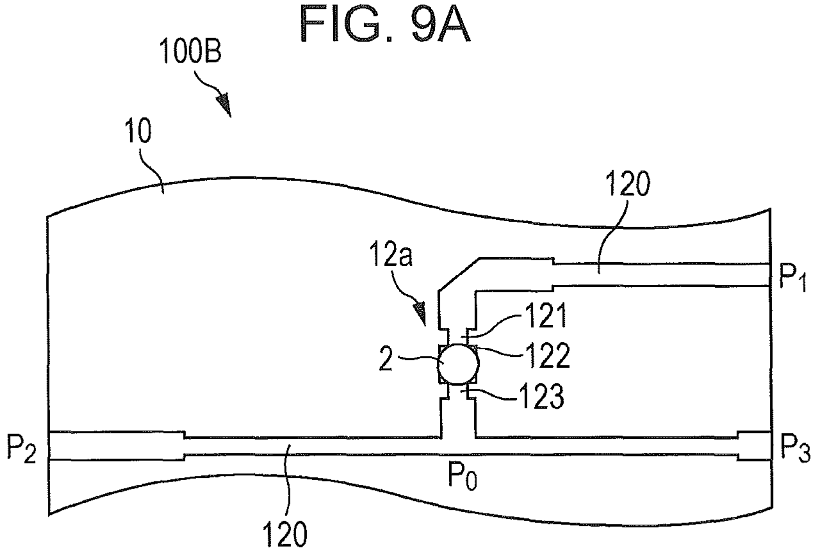
FIG. 9A schematically illustrates a configuration of a triplate line according to Example 2.
Figure 9B:
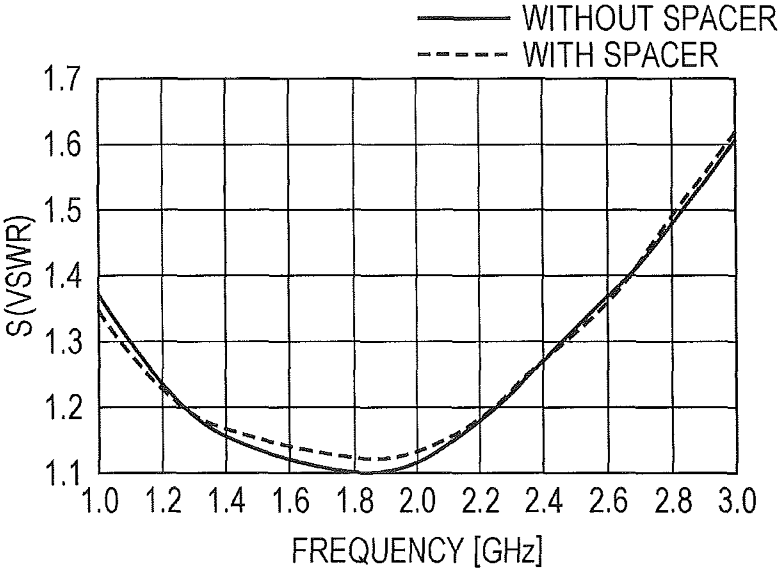
FIG. 9B shows measured VSWRs.

FIG. 9A schematically illustrates a configuration of a triplate line 100B according to Example 2. FIG. 9B shows measured VSWRs.

The central conductor 12 of the triplate line 100B extends from a first terminal portion $P_1$, through the support structure part 12*a*, and is divided into a second terminal portion $P_2$ and a third terminal portion $P_3$. A portion between the second terminal portion $P_2$ and the third terminal portion $P_3$ extends linearly, and there is a T-shaped branch portion $P_0$ between the second terminal portion $P_2$ and the third terminal portion $P_3$. The first high-impedance portion 121 is disposed on one side of the supported portion 122 adjacent to the first terminal portion $P_1$, and the second high-impedance portion 123 is disposed on the other side of the supported portion 122 adjacent to the branch portion $P_0$. The central conductor 12 is disposed between the first outer conductor 10 and the second outer conductor 11 (not shown).

For the triplate line 100B, a simulation was performed to examine how the S-parameter (VSWR) would change when the supported portion 122 was supported by the dielectric spacer 2 and when the supported portion 122 was not supported (in the latter case, the supported portion 122 was in a floating state between the first spacer member 21 and the second spacer member 22). The simulation was performed, using a three-dimensional simulator Femtet, for the case where a signal was input from the first terminal portion $P_1$. The frequency range for the simulation was 1.0 GHz to 3.0 GHz as in Example 1.

FIG. 9B shows the result of the simulation. As shown, there was no substantial difference in VSWR between the case where the supported portion 122 was supported by the dielectric spacer 2 and the case where the central conductor 12 was not supported. This result shows that impedance matching is achieved even when the supported portion 122 is supported by the dielectric spacer 2 in the triplate line 100B having a branch portion.

(Operations And Effects Of Embodiments)

The following operations and effects can be achieved according to the embodiments described above.

(1) An impedance mismatch caused by the supported portion 122 supported by the dielectric spacer 2 can be relieved by the first high-impedance portion 121 and the second high-impedance portion 123, and reflections in the transmission line 1 can be reduced over a wide frequency range. Impedance matching can be achieved even when the characteristic impedance $Z_2$ in the supported portion 122 is lower than the characteristic impedance $Z_0$ in the main body 120 of the central conductor 12. It is thus possible to support the supported portion 122 with the dielectric spacer 2 while ensuring the strength of the supported portion 122.

(2) The line width $W_2$ of the supported portion 122 is set to be greater than the line width $W_1$ of the first high-impedance portion 121 and the line width $W_3$ of the second high-impedance portion 123. Thus, even when the supported portion 122 has the through hole 122*a*, the strength of the supported portion 122 can be ensured.

(3) The dielectric spacer 2 is secured to the supported portion 122 by allowing the protrusion 211 of the first spacer member 21 to be inserted into the through hole 122*a*, so as to support the central conductor 12. Therefore, the dielectric spacer 2 can be reliably prevented from being displaced from the supported portion 122.

(4) Impedance matching can be reliably achieved by setting the characteristic impedance $Z_1$ of the first high-impedance portion 121 and the second high-impedance portion 123, the characteristic impedance $Z_0$ of the main body 120, and the characteristic impedance $Z_2$ of the supported portion 122 such that the relational equation shown in Equation 4 is satisfied.

The embodiments of the present invention described above are not intended to limit the claimed invention. It is to be noted that not all combinations of features described in the embodiments are essential to the means for solving the problems.

The present invention may be appropriately modified and implemented without departing from the scope of the invention. For example, in the embodiments described above, the strength of the supported portion 122 is ensured by setting the line width $W_2$ of the supported portion 122 to be greater than the line width $W_1$ of the first high-impedance portion 121 and the line width $W_3$ of the second high-impedance portion 123. However, the strength of the supported portion 122 may also be ensured, for example, by setting the thickness of the supported portion 122 to be greater than those of the first high-impedance portion 121 and the second high-impedance portion 123. Even in this case, the operations and effects similar to those in the embodiments described above can be achieved.

In the embodiments described above, the supported portion 122 has the through hole 122*a*, into which the protrusion 211 of the first spacer member 21 is inserted to secure the dielectric spacer 2 to the central conductor 12. However, the configuration is not limited to this. Instead of forming the through hole 122*a* in the supported portion 122, an adhesive or the like may be used to secure a spacer made of a dielectric material between the supported portion 122 and the first and second outer conductors 10 and 11. In this case, again by setting the line width $W_2$ of the supported portion 122 to be greater than the line width $W_1$ of the first high-impedance portion 121 and the line width $W_3$ of the second high-impedance portion 123, the spacer can be firmly secured to the supported portion 122 because of the resulting increase in adhesion area.

(SUMMARY OF EMBODIMENTS)

Technical ideas conceivable from the embodiments described above will now be described using reference numerals used in the embodiments. Note that the reference numerals in the following description are not intended to limit the elements of the claims to specific members described in the embodiments.

[1] A transmission line (1) having a triplate line (100) including a pair of outer conductors (10, 11) disposed in parallel with each other at a predetermined interval, and a central conductor (12) disposed in a space between the pair of outer conductors (10, 11); and a spacer (2) interposed in the space between the pair of outer conductors (10, 11) and the central conductor (12), the spacer (2) being made of a dielectric material and configured to support the central conductor (12), wherein the central conductor (12) has a supported portion (122) supported by the spacer (2), and first and second high-impedance portions (121, 123) having characteristic impedances ($Z_1$, $Z_3$) higher than a characteristic impedance ($Z_2$) in the supported portion (122), the first and second high-impedance portions (121, 123) being disposed on input and output sides, respectively, of the supported portion (122).

[2] The transmission line (1) according to [1], wherein a line width ($W_2$) in the supported portion (122) is greater than line widths ($W_1$, $W_3$) in the first and second high-impedance portions (121, 123).

[3] The transmission line (1) according to [1] or [2], wherein the spacer (2) has a first spacer member (21) having a plate-like base (210) and a protrusion (211) protruding from the base (210), and a second spacer member (22) having a fitting hole (22*a*) into which the protrusion (211) is fitted; and the supported portion (122) is supported by being sandwiched between the base (210) of the first spacer member (21) and the second spacer member (22), and has a through hole (122*a*) into which the protrusion (211) is inserted.

[4] The transmission line (1) according to any one of [1] to [3], wherein a relationship represented by Equation 4 described above is satisfied, where $Z_0$ is a characteristic impedance of a main body (120) of the triplate line (100), $Z_1$ is a characteristic impedance of both the first and second high-impedance portions (121, 123), $Z_2$ is a characteristic impedance in the supported portion (122) supported by the spacer (2), $L_1$ is a line length of both the first and second high-impedance portions (121, 123), and $L_2$ is a line length of the supported portion (122).

[5] The transmission line (1) according to any one of [1] to [4], wherein the transmission line (1) is applied to a distributor (3) placed between a transmitting device (4) and a plurality of antenna elements (50) or to a multiplexer placed between the plurality of antenna elements (50) and a receiving device.

[6] An antenna device (5) including the transmission line (1) according to any one of [1] to [4], and an antenna element (50).

What is claimed is:

1. A transmission line comprising:

a triplate line including a pair of outer conductors disposed in parallel with each other at a predetermined interval, and a central conductor disposed in a space between the pair of outer conductors; and a spacer interposed in the space between the pair of outer conductors and the central conductor, the spacer being made of a dielectric material and configured to support the central conductor, wherein the spacer includes:

a first spacer member having a plate-like base and a protrusion protruding from the base; and a second spacer member having a fitting hole into which the protrusion is fitted, wherein the central conductor includes:

a supported portion supported by the spacer;

a first high-impedance portion continued to the supported portion on an input side;

a second high-impedance portion continued to the supported portion on an output side;

a first main body continued to the first high-impedance portion; and a second main body continued to the second high-impedance portion, the first and second high-impedance portions having characteristic impedances higher than a characteristic impedance in the supported portion, wherein a line width of the first high-impedance portion is less than a line width of the supported portion, wherein a line width of the second high-impedance portion is less than the line width of the supported portion, wherein a line width of the first main body is greater than the first high-impedance portion, wherein a line width of the second main body is greater than the second high-impedance portion, wherein the supported portion is supported by being sandwiched between the base of the first spacer member and the second spacer member, and has a through-hole into which the protrusion is inserted, and wherein the dielectric material existing between the pair of outer conductors and the central conductor comprises air except for the spacer.

2. The transmission line according to claim 1, wherein a relationship represented by the following equation is satisfied:

$$Z_1 = \frac{(Z_0 Z_2 + Z_0^2)\left\{\sin\left(\frac{4\pi}{\lambda}L_1\right) + \cos\left(\frac{4\pi}{\lambda}L_1\right)\tan\left(\frac{2\pi}{\lambda}L_2\right)\right\} - 2Z_0 Z_2 \tan\left(\frac{2\pi}{\lambda}L_2\right)}{(Z_0 + Z_2)\left\{\sin\left(\frac{4\pi}{\lambda}L_1\right) + \cos\left(\frac{4\pi}{\lambda}L_1\right)\tan\left(\frac{2\pi}{\lambda}L_2\right)\right\} - 2\tan\left(\frac{2\pi}{\lambda}L_2\right)Z_0}$$

where $Z_0$ is a characteristic impedance of the first main body and the second main body of the triplate line, $Z_1$ is a characteristic impedance of both the first and second high-impedance portions, $Z_2$ is a characteristic impedance in the supported portion supported by the spacer, $L_1$ is a line length of both the first and second high-impedance portions, and $L_2$ is a line length of the supported portion.

3. The transmission line according to claim 1, wherein the transmission line is applied to a distributor placed between a transmitting device and a plurality of antenna elements or to a multiplexer placed between the plurality of antenna elements and a receiving device.

4. An antenna device comprising:
the transmission line according to claim 1; and
an antenna element.

5. The transmission line according to claim 1, wherein the spacer is interposed in the space between the pair of outer conductors and the central conductor such that only air and the spacer exists in the space.

6. The transmission line according to claim 1, wherein a cross-sectional shape and a thickness of the central conductor are set according to a target impedance of the triplate line.

7. The transmission line according to claim 1, wherein a distance from the central conductor to the pair of outer conductors is set according to a target impedance of the triplate line.

8. The transmission line according to claim 1, wherein the air exists between the pair of outer conductors and the central conductor is supported by the spacer in the space between the pair of outer conductors.

9. The transmission line according to claim 1, wherein the spacer includes a dielectric spacer which includes the first spacer member and the second spacer member,
wherein the protrusion of the first spacer member protrudes continuously from the base, and
wherein the second spacer member has a circular plate-like member having the fitting hole in a center thereof.

10. The transmission line according to claim 9, wherein a diameter of the base of the first spacer is greater than a line width of the supported portion.

11. The transmission line according to claim 9, wherein a diameter of the base of the first spacer is in a range of 5 mm to 7 mm.

12. The transmission line according to claim 9, wherein an outside diameter and a thickness of the second spacer member equal a diameter and a thickness of the base of the first spacer member.

13. The transmission line according to claim 9, wherein the first spacer member is disposed on a first side of the central conductor, and
wherein the second spacer member is disposed on a second side of the central conductor, the protrusion protrudes from the first side to the second side.

14. The transmission line according to claim 1, wherein the central conductor includes the through-hole such that the spacer is attached to the central conductor via the through-hole.

15. The transmission line according to claim 1, wherein an outer edge of the spacer protrudes beyond an outer edge of the central conductor.

16. The transmission line according to claim 1, wherein a line length of the supported portion supported by the spacer is greater than a line length of the first high-impedance portion and a line length of the second high-impedance portion.

* * * * *